US006999523B2

(12) United States Patent
Posti

(10) Patent No.: US 6,999,523 B2
(45) Date of Patent: Feb. 14, 2006

(54) MULTI-FREQUENCY TRANSMITTER USING PREDISTORTION AND A METHOD OF TRANSMITTING

(75) Inventor: Harri Posti, Oulu (FI)

(73) Assignee: Nokia Corporation, Espoo (FI)

( * ) Notice: Subject to any disclaimer, the term of this patent is extended or adjusted under 35 U.S.C. 154(b) by 42 days.

(21) Appl. No.: 09/887,481

(22) Filed: Jun. 22, 2001

(65) Prior Publication Data
US 2002/0021764 A1 Feb. 21, 2002

Related U.S. Application Data

(63) Continuation of application No. PCT/EP98/08445, filed on Dec. 24, 1998.

(51) Int. Cl.
H04K 1/02 (2006.01)
H04L 25/03 (2006.01)
H04L 25/49 (2006.01)

(52) U.S. Cl. ...................... 375/296; 375/297
(58) Field of Classification Search ............... 375/296, 375/297; 330/284; 455/126
See application file for complete search history.

(56) References Cited

U.S. PATENT DOCUMENTS

| | | | |
|---|---|---|---|
| 5,530,920 A | | 6/1996 | Takeda |
| 5,598,436 A | | 1/1997 | Brajal et al. |
| 5,937,011 A | * | 8/1999 | Carney et al. ............... 375/297 |
| 6,075,411 A | * | 6/2000 | Briffa et al. ................ 330/149 |
| 6,104,241 A | * | 8/2000 | Cova et al. ................. 330/149 |
| 6,188,732 B1 | * | 2/2001 | Rha ........................... 375/297 |
| 6,275,685 B1 | * | 8/2001 | Wessel et al. ............... 455/126 |
| 6,400,774 B1 | * | 6/2002 | Matsuoka et al. .......... 375/295 |
| 2001/0014592 A1 | * | 8/2001 | Helms ........................ 455/91 |

FOREIGN PATENT DOCUMENTS

| | | |
|---|---|---|
| EP | 0891041 A1 | 1/1999 |
| JP | 7-283743 | 10/1994 |
| WO | WO 94/17599 | 8/1994 |
| WO | WO 96/12343 | 4/1996 |
| WO | WO 97/30521 | 8/1997 |

OTHER PUBLICATIONS

Mats Johansson and Michael Faulkner; "Linearization of Wideband RF Power Amplifiers." .

M. Johansson and L. Sundstrom; "Linearisation of RF multicarrier amplifiers using Cartesian feedback", Electronic Letters, Jul. 7, 1994, vol. 30, No. 14, pp. 1110-1111.

Mats Johansson, Thomas Mattsson, Lars Sundstrom and Michael Faulkner; "Linearization of Multi-carrier Power Amplifiers", 1993 43$^{rd}$ Vehicular Technology Conference, pp., 684-687.

"Digital Modulation in Communications Systems—An Introduction", Application Note 1298, Hewlettett-Packard Company, USA Jul./1997, pp. 1-48.

* cited by examiner

Primary Examiner—Phuong Phu
(74) Attorney, Agent, or Firm—Squire, Sanders & Dempsey L.L.P.

(57) ABSTRACT

A multi frequency carrier transmitter comprises input means for receiving a plurality of different digital signals to be transmitted. The different signals are to be transmitted on different carrier frequencies. Amplifier means receive a composite signal comprising the different signals at the respective carrier frequencies and amplify the composite signal. Predistortion means predistort the plurality of digital signals prior to amplification of the composite signal by the amplification means. The predistortion provided by the predistortion means is subsequently altered in dependence on the difference between the input signals and the output at the amplifier means.

33 Claims, 6 Drawing Sheets

Principle of an NCO-Based Channeliser

MULTI-FREQUENCY TRANSMITTER USING PREDISTORTION AND A METHOD OF TRANSMITTING

This application is a continuation of international application Ser. No. PCT/EP98/08445, filed Dec. 24, 1998.

BACKGROUND OF THE INVENTION

1. Field of the Invention

The present invention relates to a transmitter and a method of transmitting and in particular, but not exclusively, for use in a telecommunications network.

2. Description of the Related Art

In known wireless telecommunication networks 2 such as illustrated in FIG. 1, the area covered by the network 2 is divided into a plurality of cells 4. Each cell 4 has associated therewith a base transceiver station 6. Each base station 6 is arranged to communicate with terminals located in the cell 8 associated with that base station 6. The terminals 8 may be mobile terminals which are arranged to move between the cells 4.

Each base station 6 in the GSM (Global System for Mobile communications) is arranged to transmit N frequencies out of M available frequencies C1 ... CM, as illustrated in FIG. 2a. Each of the M frequencies is different and within the bandwidth allocated for signals transmitted by base stations. Each channel is divided into a plurality of sequential frames F one of which is shown in FIG. 2b. Each frame F is divided into eight slots S0 ... S7. The GSM standard is a time/frequency division multiple access system (F/TDMA) and accordingly signals will be transmitted by the base station to different mobile stations in different time slots. In other words, the base station will transmit signals to different mobile stations in different time slots at the same frequency. N is usually much less than M.

With known base transceiver stations a separate transmitter circuit is generally provided for each different frequency. For illustrative purposes a known base transceiver station is shown in FIG. 3. For the purpose of clarity only the transmit part 10 of the base station 12 is shown in FIG. 3.

The transmit part 10 comprises N different transmit paths 14–14', one path being provided for each frequency. For clarity only the arrangement of one path 14 is shown but it should be appreciated that each path 14–14' has the same structure. Each path 14–14' comprises a modulator 16 which modulates the signal to be transmitted. The modulated signal is output to an amplifier 18 which amplifies the modulated signal. The output of the amplifier 18 is then filtered by a bandpass filter 20 which removes or attenuates unwanted noise and other emissions such as spurious signals and intermodulation products.

The output of each transmit path 14–14' is connected to the input of a combiner 22 which combines the signals from each path 14–14' to provide a multicarrier signal. The output of the combiner 22 is connected to an antenna 24 which transmits the multicarrier signal containing each of the N different channels to the terminals in the cell served by the base station.

It is desirable to reduce the number of transmit paths to one as this would significantly reduce the costs involved. However, if a single amplifier were to be used with a number of channels at the same time, that amplifier would need to be very linear to prevent the leakage of power into adjacent channels. The leakage of power into adjacent channels is undesirable in that a reduction in system capacity and/or a reduction in signal quality results. Linear amplifiers are known but even these amplifiers are not linear when operated near the peak capacity of the amplifier.

Several methods have been proposed for ensuring that amplifiers are linear. It is known, for example, from International Patent Application No. WO 97/30521 to use predistortion in a transmitter to try to ensure linearity. Predistortion is used to try to ensure that a transmitter is linear. Amplifiers introduce non linearity. With predistortion, a signal is distorted prior to being input to the amplifier which causes the distortion. The predistortion applied is the inverse of the distortion caused by the amplifier. Thus the output of the amplifier will be linear with respect to the signal prior to the application of the predistortion and the passing of that signal through the amplifier. The transmitter illustrated in this document is of the type where a different transmit path is provided for each channel.

Reference is also made to the following papers: Linearization of Multi-Carrier Power Amplifiers by Johansson, Mattsson and Faulkner (IEEE 1993); Linearization of RF multicarrier amplifiers using Cartesian Feedback by Johansson and Sundstrom (Electronics Letters Jul. 7, 1994); and Linearization of Wideband RF Power Amplifiers by Johansson and Faulkner. These documents disclose a transmitter which uses Cartesian feedback to correct for the non linearity of the amplifier. A signal from the output of the power amplifier is fedback and demodulated. The demodulated signal is subtracted from the input signals to provide an error signal. The error signal is used to drive the modulator and the amplifier. The feedback is performed in the analogue domain. In these documents, a separate Cartesian feedback module is provided for each channel. It should be appreciated that Cartesian feedback is by its nature a narrow band linearization technique.

SUMMARY OF THE INVENTION

It is an aim of embodiments of the present invention to provide a transmitter which can have only a single transmit path and which solves or at least mitigates the problems caused by a non linear amplifier.

According to one aspect of the present invention, there is provided a multi frequency carrier transmitter comprising input means for receiving a plurality of different digital signals to be transmitted, said different signals to be transmitted on different carrier frequencies; amplifier means for receiving a composite signal comprising said different signals at the respective carrier frequencies and amplifying said composite signal; and predistortion means for predistorting said plurality of digital signals prior to amplification of the composite signal by said amplification means, said predistortion provided by said predistortion means being subsequently altered in dependence on the difference between said input signals and the output at said amplifier means.

Accordingly, embodiments of the present invention provide a multi carrier transmitter which is able to deal with the problems of nonlinearity by using predistortion. The predistortion can be implemented more simply than the feedback method discussed in the prior art.

The input means are preferably arranged to separately receive each of the different signals. Combiner means are preferably provided between the input means and the amplifier means for combining said plurality of different signals to provide a composite signal. This may be the composite signal input to the amplifier means or may be a composite signal at a lower, intermediate frequency. In the latter case, that composite signal at a lower frequency would be upconverted to provide the composite signal input to the amplifier means.

Preferably the predistortion means are arranged to individually predistort each of the different signals before the plurality of different signals are combined by said combiner. This has the advantage that it is easy to ensure that different predistortion coefficients appropriate for the respective carrier frequency are applied to each of the signals which will be at the respective different carrier frequencies.

Alternatively, the predistortion means may be arranged to predistort the composite signal after the plurality of signals have been combined by the combiner.

A feedback path may be arranged between the amplifying means and the predistorting means. Preferably, the predistorting means is arranged to compare the output from the amplifying means from the feedback path with the signals received by the receiving means and to provide, if necessary, at least one new predistortion value to be applied to at least one subsequent signal received by the receiving means. In this way, the predistorting means can adapt to changes in the operating conditions of the amplifier means.

Preferably, means are provided in the feedback path for separating the output of the amplifying means into a plurality of different signals. The predistorting means is preferably arranged to compare each of the separated signals with the corresponding signals received from the input means and to determine if the at least one predistortion value needs to be altered.

Alternatively, the predistorting means is arranged to compare the composite signal from the amplifying means with a plurality of different signals to provide, if necessary, the at least one new predistortion value.

The predistortion means are preferably arranged to provide a plurality of predistortion coefficients, at least one predistortion coefficient being provided for each multi carrier frequency. Different predistortion coefficients are preferably provided for each multi carrier frequency regardless of the way in which the predistortion is achieved in practice.

Preferably, the predistortion coefficients for each multi-carrier frequency take into account characteristics of other of the said multicarrier frequencies. Those characteristics can include one or more of the following: frequency; and distortion caused by the amplifier means.

The amplifier means is preferably a nonlinear amplifier. The predistortion means is preferably arranged to compensate for the nonlinearity of the phase and/or amplitude of the output of the amplifier.

A digital to analogue converter may be provided for converting the plurality of signals to analogue form before said signals are amplified by said amplifier means.

The transmitter is preferably incorporated in a base station or alternatively in a mobile station.

According to a second aspect of the present invention, there is provided a multi carrier frequency transmission method comprising the steps of receiving a plurality of different digital signals to be transmitted, said different signals to be transmitted on different carrier frequencies; combining said plurality of different signals to provide a composite signal comprising the different signals at the respective carrier frequencies; and amplifying said composite signal, wherein the method further comprises the steps of: predistorting the plurality of different digital signals prior to amplification of the composite signal by the amplification means; and altering the predistortion applied to subsequent signals in dependence on the difference between said different signals and the amplified signal.

BRIEF DESCRIPTION OF THE DRAWINGS

For a better understanding of the present invention and as to how the same may be carried into effect, reference will now be made by way of example to the accompanying drawings in which.

DETAILED DESCRIPTION OF THE PREFERRED EMBODIMENTS

Figure 1:
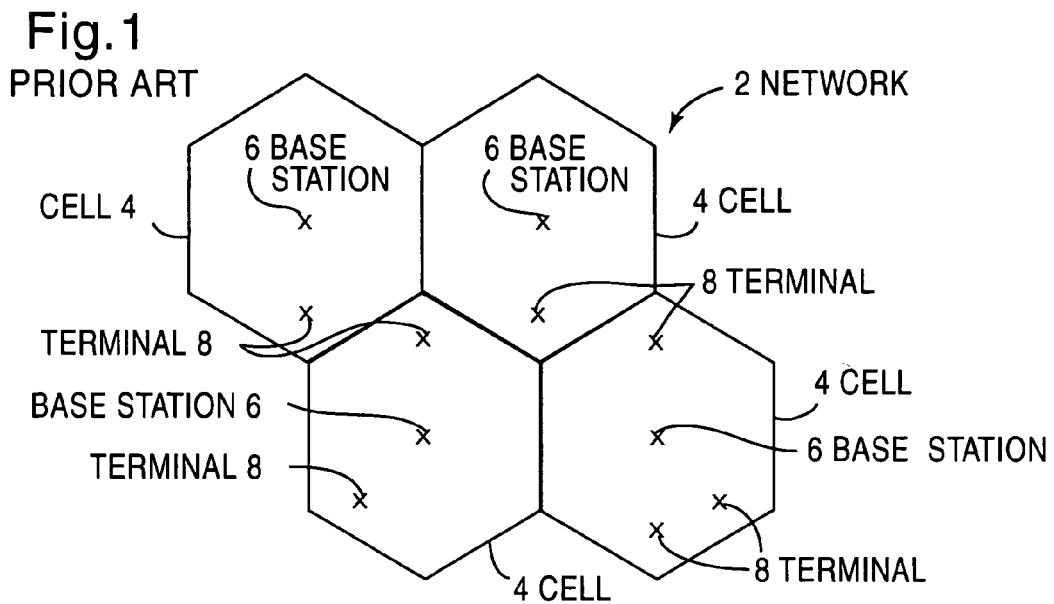
FIG. 1 shows a typical wireless telecommunications network.
Figure 2A:
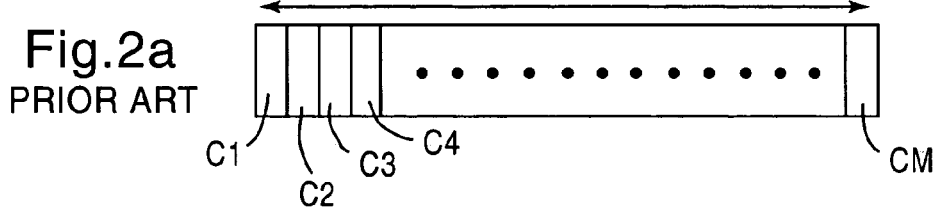
FIG. 2a shows the M available frequencies for transmitting to terminals by base stations.
Figure 2B:
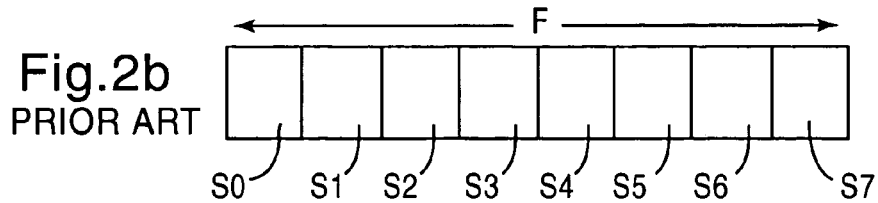
FIG. 2b shows the structure of a frame.
Figure 3:
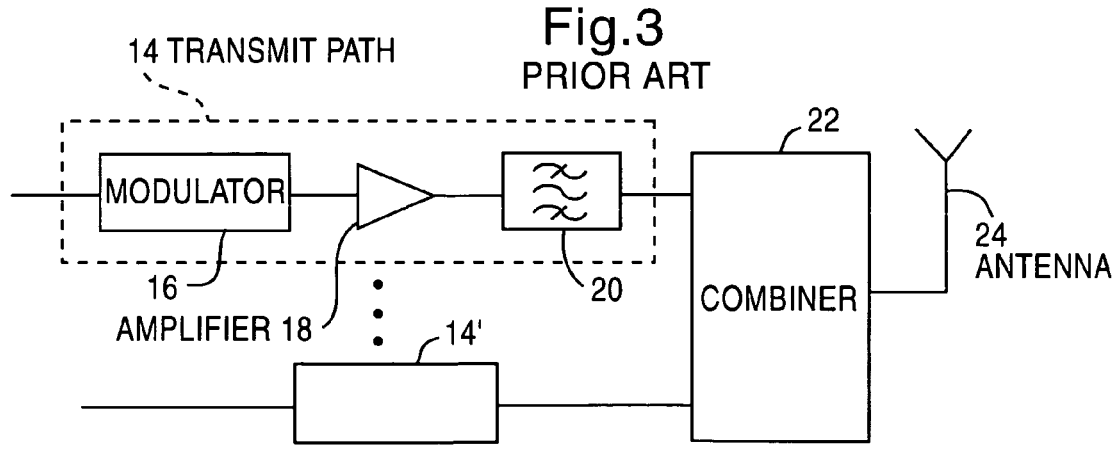
FIG. 3 shows the transmit part of a known base station.
Figure 4:
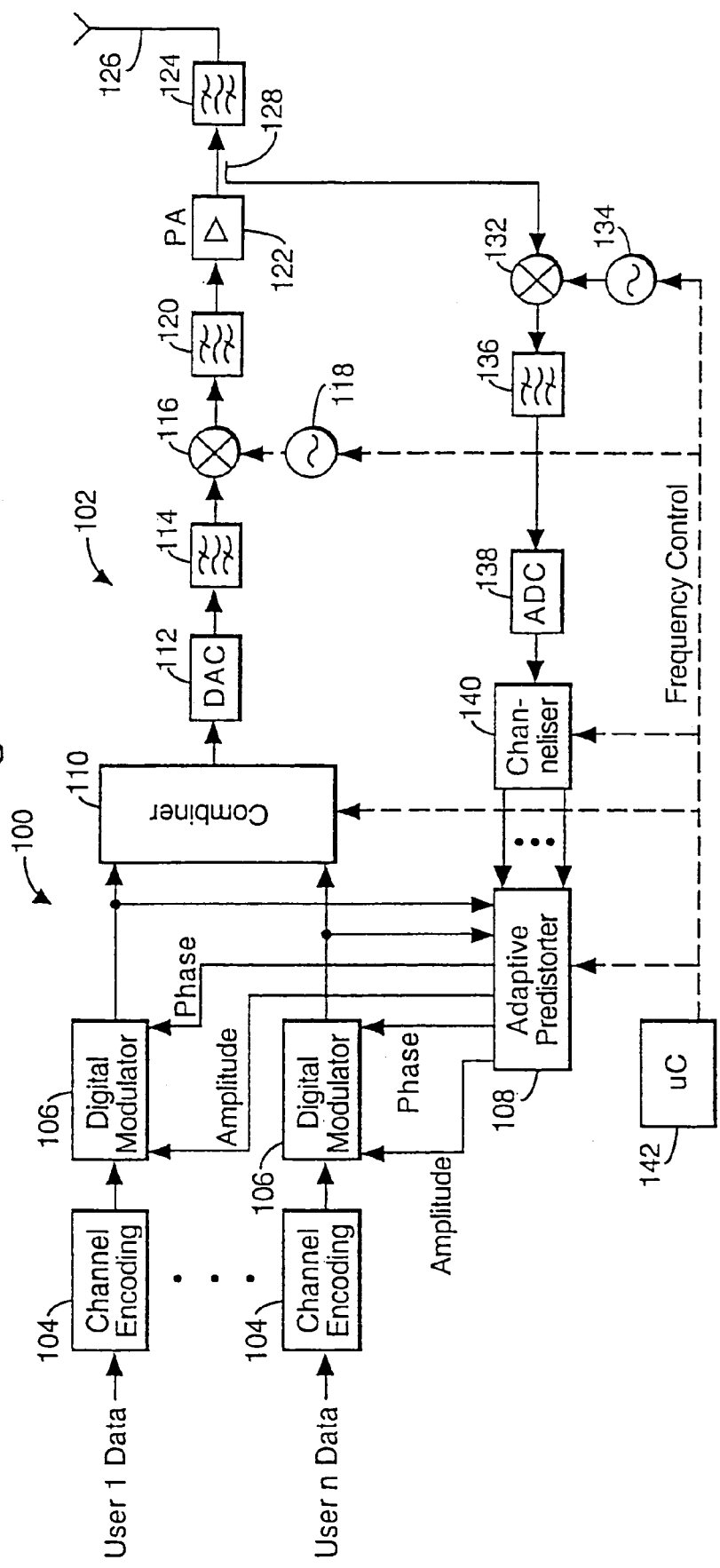
FIG. 4 shows the transmit part of a first base station embodying the present invention.

Reference will now be made to FIG. 4 which shows a first embodiment of the present invention. In particular, the transmit part 102 of the base station 100 is shown. The base station 100 is in a cellular system of the type shown in FIG. 1.

The transmit part 102 of the base station 100 comprises N channel encoders 104 where N is the number of different frequencies on which the base station 100 will transmit signals. Each channel encoder 104 receives the data to be transmitted on the particular frequency associated with the given channel encoder 104. The data is placed in a suitable form for transmission. This may include digitising the data, encoding the data, interleaving the data and/or any other step required to be carried out. As mentioned hereinbefore, each channel is on a different frequency after the modulator. The signals output by the channel encoders 104 are in digital form and are at a baseband frequency. Coding, interleaving etc is performed on the digital baseband signals.

The output of each channel encoder 104 is input to a respective digital modulator 106. Each digital modulator 106 also receives two outputs from the adaptive predistorter 108. The first output from the predistorter 108 provides one or more amplitude coefficients which are used to predistort the signal which is output by the digital modulator to compensate for the non linearity of an amplifier 122 with respect to amplitude. The second output from the predistorter 108 provides one or more phase coefficients which are used to predistort the signal which is output by the modulator 106 to compensate for phase distortion provided by the amplifier 122. The amplifier 122 will be described in more detail hereinafter.

The digital modulators 106 are arranged to modulate the output of the respective channel encoders 104 according to the modulation method use by the telecommunications system of which the base station 100 forms a part. In the case of the GSM standard the modulators 106 will perform Gaussian minimum shift keying (GMSK). In general terms the modulators 106 take the baseband input from the respective channel encoder 104, pass that input through a shaping filter and mix the signal with a carrier signal at an intermediate frequency which is higher than the baseband frequency but less than the frequency at which the signals are transmitted to thereby provide a modulated output.

The predistortion to compensate for the phase and amplitude distortion introduced by the amplifier 122 can take place at the same time. The predistortion can be performed during or more preferably after the modulation has been carried out by the modulator 106.

The output of each of the digital modulators 106 are input to a signal combiner 11 and to the adaptive predistortor 108. The combiner 110 combines the outputs of all of the modulators 106 to provide a single output. That output contains the signals for each of the frequencies. It should be appreciated that the output of the combiner 110 provides a single stream of digital words which represent the amplitude of the composite signal at each sampling instant. The output of the combiner 110 is input to a digital to analogue converter 112 which converts the digital wideband signal output by the combiner to an analogue signal.

The output of the digital to analogue converter 112 is input to a first bandpass filter 114 which removes signal components generated by the digital to analogue converter 112 which are outside the intermediate frequency band. The output of the first bandpass filter 114 is input to a first mixer 116. The first mixer 116 also receives an input from a first local oscillator 118. The output of the first bandpass filter 114 is thus mixed by the first mixer 116 with the output of the first local oscillator 118 to provide an output containing the N signals, each of which is at the radio frequency at which that signal is to be transmitted. Each of the N signals will thus be at a different radio frequency. The frequency of the first local oscillator 118 is thus selected to allow the intermediate frequency signals to be upconverted to the required radio frequencies by the first mixer 116.

The output of the first mixer 116 is input to a second bandpass filter 120 which removes any signal components introduced by the first mixer 116 which are outside the radio frequency band of the signals to be transmitted.

The output of the second bandpass filter 120 is input to the power amplifier 122 which amplifies the received input. The output of the amplifier 122 is input to a third bandpass filter 124 which is arranged to filter out any signal components introduced by the amplifier 122 which fall outside the radio frequency band of the signals to be transmitted. The output of the third bandpass filter 124 is passed to an antenna 126 which transmits the signals to the terminals in the cell associated with the base station.

Between the amplifier 122 and the third bandpass filter 124, there is arranged a coupler 128 which is arranged to sample a small part of the signals which are transmitted. In other words, the coupler 128 allows a small proportion of the signals to be transmitted to be sampled. The coupler 128 outputs an analogue sample of the output signal which is typically below the power of the input to the third bandpass filter 124.

The output of the coupler 128 is input to a second mixer 132 which receives a signal from a second local oscillator 134. The signals which are received from the coupler 128 are in the radio frequency band. The signal from the second local oscillator 134 is at a frequency such that when the signals from the coupler 128 are mixed with signal from the local oscillator 134, the output of the second mixer 132 consists of the signals which were transmitted but at the intermediate frequencies. The intermediate frequencies output by the second mixer 132 may but not necessarily be the same as the intermediate frequencies input to the first mixer 116. Accordingly, the frequency of the signals provided by the first and second oscillators 118 and 134 may be the same. In that case, a single oscillator may be provided.

The output of the second mixer 132 is input to a fourth bandpass filter 136 which filters out any signal components introduced by the second mixer 132 which are outside the intermediate frequency band. The output of the fourth bandpass filter 136 is input to an analogue to digital converter 138 which is arranged to convert the analogue signals to digital form.

The digital signals are output by the analogue to digital converter 138 to a channelizer 140. The channelizer 140 divides the signals into the N different frequencies corresponding to the frequencies on which those signals were transmitted. The channelizer 140 is able to distinguish the N signals as they are all at different frequencies. The channelizer 140 provides N outputs, one for each of the frequencies. Each of the N outputs provided by the channelizer 140 are input to the adaptive predistorter 108. The channelizer 140 can be provided in any suitable way including a bank of digital downconverters and fast fourier transform circuitry.

The adaptive predistorter 108 thus receives for each channel a version of the signal before it passes through the combiner 110 and subsequent elements of transmit part 102 of the base station 100 (from the respective digital modulator) and a version of the signal after it has passed through the transmit part 102 (from the channelizer 140). The predistorter 108 thus compares like versions of the same signal eg, both signals will be modulated at the same frequencies. The adaptive predistorter 108 is arranged to compare these signals. If the coefficients which the predistorter 108 outputs to the given digital modulator are good then the signal which is transmitted should be the same as the respective signal which is input to the combiner 110. Ideally the only differences should be in scale of the signals. If the signals differ, the predistorter 108 arranged to calculate new predistortion coefficients which take into account the results of the comparison.

Thus, the predistorter 108 compares for each frequency the signal which was transmitted with the signal output by the respective digital modulator 106. For each frequency it is determined if the current predistortion coefficients are acceptable and if not calculates new coefficients to be used for that channel. Predistortion is thus performed individually for each frequency prior to signal combining. The predistortion coefficients for each frequency are determined based on feedback from the corresponding frequency as transmitted. The predistortion coefficients are arranged to compensate for non-linearity with respect to amplitude and also phase distortion. The phase and amplitude of the signals of the digital modulators 106 are altered in accordance with these coefficients. How these coefficients are used will depend on the modulation method. In the simplest cases, the coefficients could be added to the signal or used as multipliers.

A microcontroller 142 is provided which provides control signals to the predistorter 108, the combiner 110, the channelizer 140 and the first and second local oscillators 118 and 134. The microcontroller 142 is arranged to control the frequency of the signals generated by the oscillators 118 and 134.

The embodiment of FIG. 4 has the advantage that each of the individual channels are input to the adaptive predistorter on the input side and the individual channels are received from a channeliser on the output side. Therefore, the predistortion coefficients that are calculated by the adaptive predistorter are based on all of the carriers. This allows optimal performance to be obtained since all the information is available.

The combiner 110 requires information on the frequency if an inverse fast fourier transform combining technique is required. The algorithm performed by the adaptive predistorter 108 may also, as discussed hereinbefore utilise frequency information when calculating the predistortion coefficients.

Figure 7:
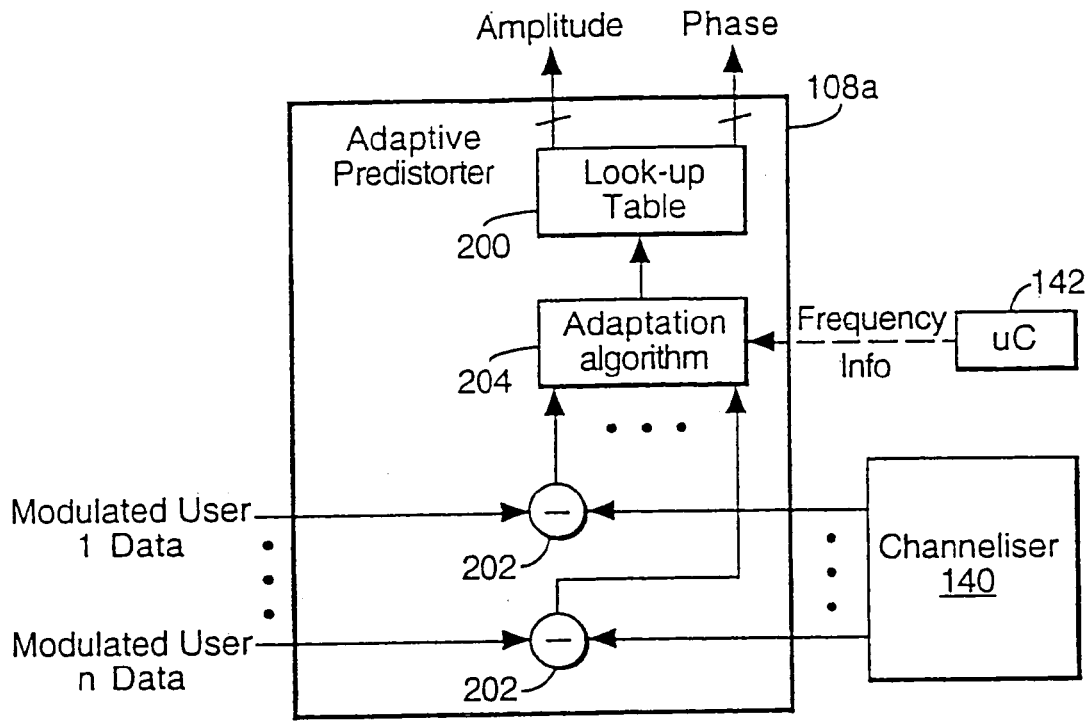
FIG. 7 shows a predistorter, which can be used in the first and second embodiments, in more detail.

Reference will now be made to FIG. 7 which shows a first predistorter which can be used in the arrangement of FIG. 4. The predistortor 108a comprises n subtracters 202 each of which receives a respective one of the outputs from the digital modulators 106. Each subtracter also receives a input from the channeliser 140. Each subtracter 202 receives the output from the modulator 106 corresponding to a given user and the output from the channeliser 140 which also corresponds to that user. The subtracter 202 subtracts one of the outputs from the other to thus determine the difference between those signals. The output of each subtracter 202 thus constitutes a difference signal which is input to an adaption algorithm block 204 which on the basis of the input received from the subtractors 202 calculates, if necessary, new amplitude and phase predistortion coefficients. These amplitude and phase coefficients are output to a look-up table 200 where they are stored. The values from the look-up table 200 are supplied, as shown in FIG. 4, to the respective digital modulators 106. The adaption algorithm block 204 may also receive an input from the microcontroller 142 which provides information as to the frequency of the signals. This information can be used by the adaption algorithm block 204 to calculate the amplitude and phase predistortion coefficients.

Figure 5:
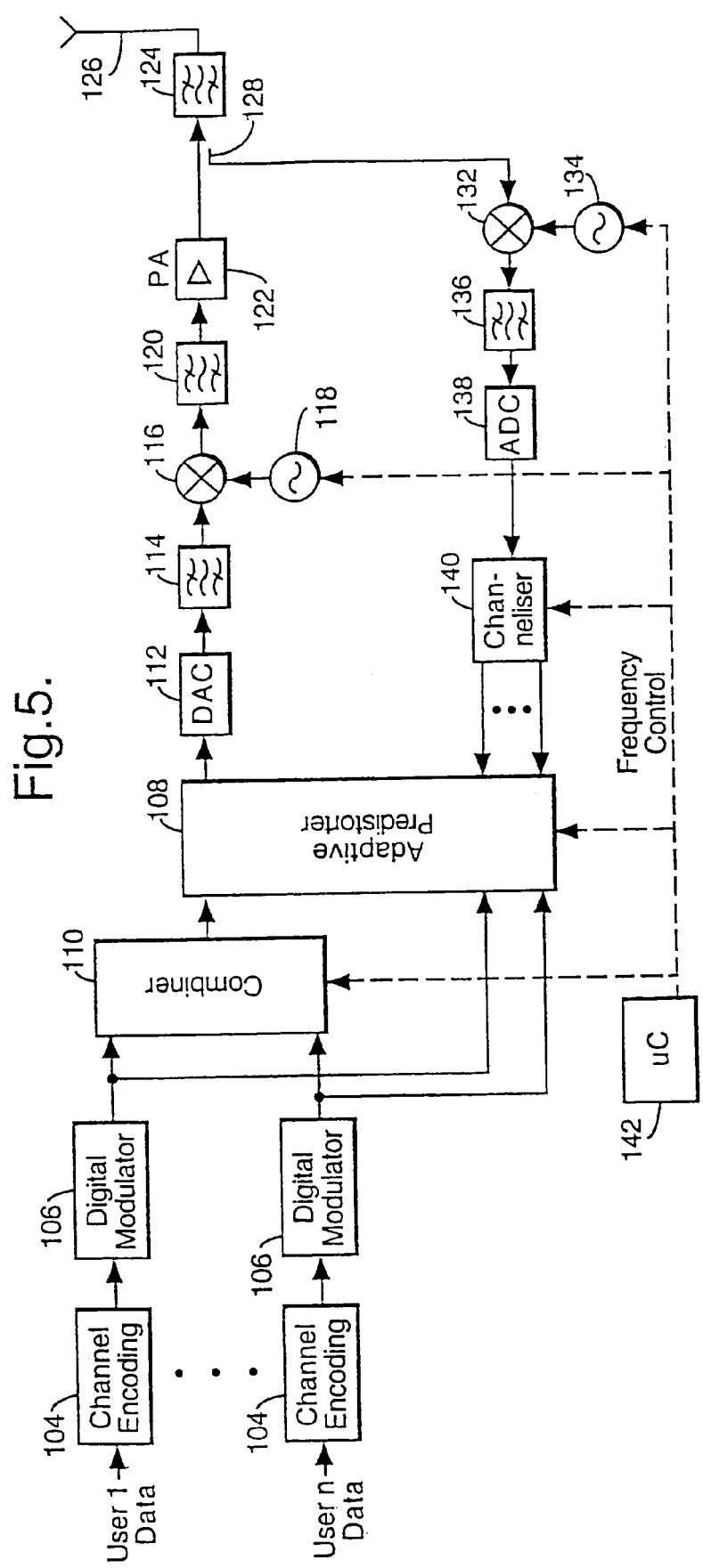
FIG. 5 shows the transmit part of a second base station embodying the present invention.

Reference will now be made to FIG. 5 which shows a second embodiment of the present invention. The embodiment shown in FIG. 5 is similar to the embodiment shown in FIG. 4 and accordingly only the differences between the first and second embodiments will be described.

The adaptive predistorter 108 does not, as in the first embodiment, have outputs connected to the digital modulators 106. The output of the combiner 110 is connected to the input of the predistorter 108. The output of the predistorter 108 is connected to the input of the digital to analogue convertor. The predistorter 108 thus predistorts the multicarrier output of the combiner 110 and outputs a predistorted multicarrier signal. The feedback path is the same in the first and second embodiments and accordingly the predistorter 108 operates in a similar manner to that shown in the first embodiment. However, phase correction is not applied and the amplitude correction is the same for all frequencies. This solution is simple but may not provide the required performance in all cases.

Figure 8:
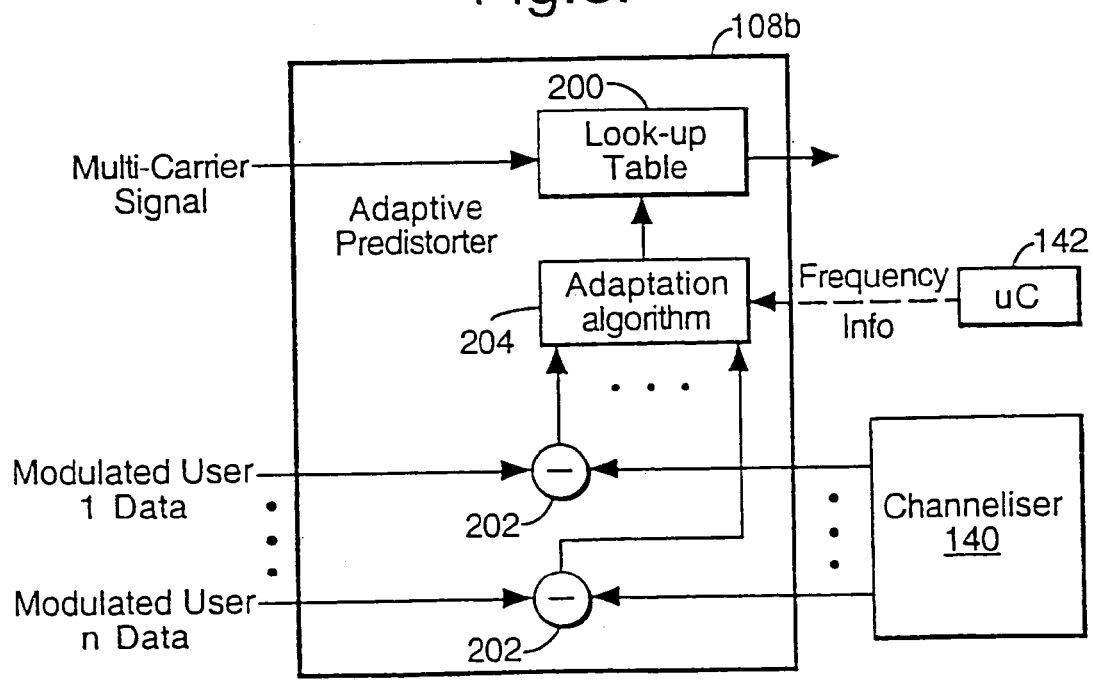
FIG. 8 shows a second predistorter, which can be used in the first and second embodiments, in more detail.

Reference will now be made to FIG. 8 which shows a second predistorter 108b which can be used in the second embodiment shown in FIG. 5. This second predistorter 108 comprises n subtractors 208 each of which receives an output from a respective one of the digital modulators. Each subtracter 208 also receives a corresponding input from the channelizer 140 as in the first embodiment. Each subtracter 208 thus receives two modulated signals. The two signals received by each subtracter 208 are subtracted one from the other to generate a difference signal. This output difference signal is input to the adaption algorithm block 204 which is the same as discussed in relation to the first predistorter of FIG. 7. As with the first predistorter of FIG. 7, the adaption algorithm block 204 also receives an input from the microcontroller 142 with information concerning the frequency.

The adaption algorithm block 204 provides amplitude coefficients on its output which are output to the look-up table 200. Unlike the embodiment shown in FIG. 7, the look-up table receives the multicarrier signal from the combiner 110 which defines an address in the look-up table. Accordingly, the multicarrier signal is modified in accordance with the amplitude values from the look-up table and output to the digital to analogue convertor 112.

Figure 10:
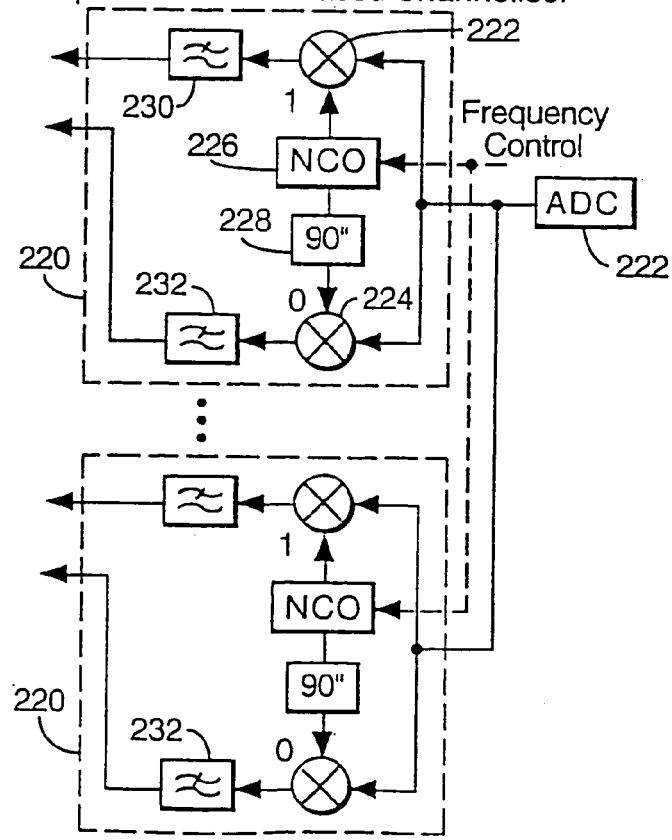
FIG. 10 shows a channelizer.

Reference is now made to FIG. 10 which shows a possible construction of the channeliser 140. The channeliser comprises n blocks 220, with one block provided for each frequency. Each block of the channeliser 220 comprises an input for receiving the output of the analogue to digital converter 138 and a frequency control signal from the microcontroller 142. The output from the analogue to digital converter 138 is input to first and second multipliers 222 and 224. The first multiplier 222 produces the I or in-band, component of the input signal whilst the second multiplier 224 produces the Q, or quadrature-phase component of the input signal. Each of the multipliers 222 and 224 receives a frequency from the numerically controlled oscillator 226. The frequency of the oscillator 226 is controlled by the frequency control input. The output of the oscillator 226 is connected directly to one of the multipliers 222 whilst the output for the second multipliers 224 is connected to a phase shifter 228 which shifts the phase of the output signal from the oscillator 226 by 90°. The phase shifted output signal of the oscillator 226 is input to the second multipliers 224.

The output of each of the first and second multipliers 222 and 224 are connected to filters 230 and 232 which are arranged to filter out signal components introduced by the respective multipliers as well as other carriers within the multicarrier signal.

Each element 220 thus provides two outputs, one for the I component and one for the Q component for each frequency.

The frequency information provided by the microcontroller 142 is used by the predistorter 108 in the third embodiment to reconstruct the composite signal using any appropriate method. The methods require frequency information. One example is the inverse fast fourier transform technique which creates a spectral representation of the signal sampled in the time domain.

Figure 6:
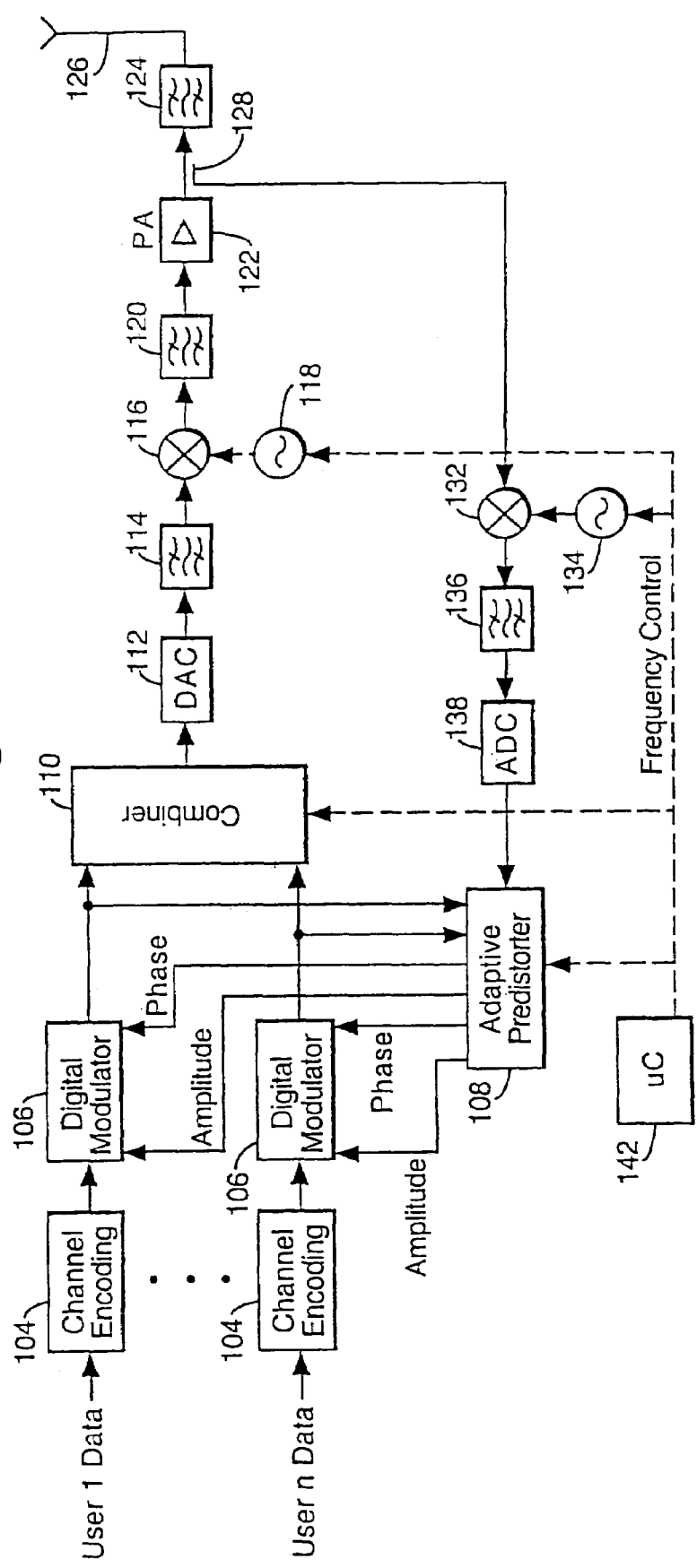
FIG. 6 shows the transmit part of a third base station embodying the present invention.

Reference will now be made to FIG. 6 which shows a third embodiment of the present invention. As with the second embodiment of the present invention, only the differences between the first and third embodiments will be discussed.

The channelizer 140 of FIG. 4 has been omitted from the embodiment of FIG. 6. The output of the analogue to digital converter 138 is thus connected directly to the input of the predistorter 108. As information is only available on the composite signal, the predistorter is arranged to create a reference.

Figure 9:
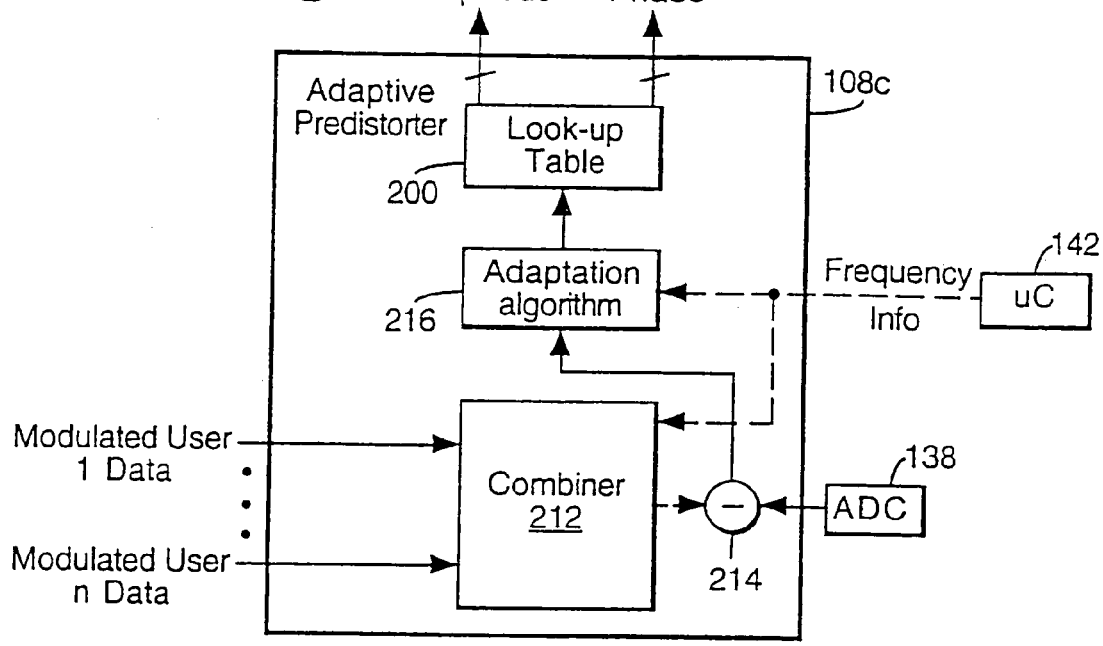
FIG. 9 shows a third predistorter which can be used in the third embodiments, in more detail.

Reference will now be made to FIG. 9 which shows a third embodiment of a predistorter which can be used in the embodiment of FIG. 6. The third predistorter 108c receives the outputs from the digital modulators 106. The output of each of the digital modulators 106 is input to a combiner 212 which combines the outputs of the modulators 200 to provide a single signal which is input to a single subtracter 214. The single subtracter 214 also receives the output of the analogue to digital converter 138. The single subtracter 214 provides a difference signal as a result of subtracting one of the outputs from the combiner 212 and the analogue to digital converter 138 from the other. This difference signal is input to an adaption algorithm block 216 which calculates, if necessary new amplitude and phase distortion coefficients. As with the first two predistorters, the adaption algorithm block 216 receives an input from the microcontroller 146 with information concerning the frequency. This information is also input to the combiner 212. The new values are stored in the look-up table 200.

In the previously described embodiments, the output from the digital modulators are input to the adaptive predistorter. In an alternative embodiment, the output of the channel encoders may be output to the adaptive predistorter instead. In those circumstances, the channeliser may need also to demodulate the signals so that the adaptive predistortor compares like with like.

The embodiments which calculate the predistortion coefficients for each carrier can be modified so that the frequency, distortion etc on the other carriers are taken into consideration.

In the embodiments where the composite signal is predistorted, the combiner output consists of amplitude words, the correction occurring by adjusting the magnitude of the words. Nonlinearities in the amplifier output could be compensated by correcting the magnitude of the combiner output words with an inverse function. The correction may thus be dependent on the particular combiner output. This might occur by indexing a look-up table with the combiner output word and outputting the respective contents to the digital to analogue converter.

In the embodiments of the present invention described hereinbefore, only one set of intermediate frequencies is used. However in alternate embodiments of the present invention, there may be a further stage where the frequencies of the signals at a first set of intermediate frequencies may be upconverted to a second set of intermediate frequencies which are greater than the first set of intermediate frequencies but less than the radio frequency.

Whilst the embodiment of the present invention has been described in the context of the GSM standard it should be appreciated that embodiments of the present invention are applicable to any other TDMA system, any system using spread spectrum techniques such as code division multiple access (CDMA), frequency division multiple access (FDMA) or hybrids of any of these methods. For example GSM is an FDMA/TDMA hybrid.

It should be appreciated that although the preferred embodiment of the present invention has been described in the context of a base transceiver station, embodiments of the present invention are also applicable to mobile stations and terminals which are arranged to communicate with the base station. Embodiments of the present invention can be used with any suitable transmitter which is sending signals at more than one frequency at the same time in both wireless and wired environments.

What is claimed is:

1. A multi frequency carrier transmitter comprising:
    input means for receiving a plurality of different digital signals to be transmitted, said different digital signals to be transmitted on different carrier frequencies;
    digital modulators for modulating said different digital signal at respective modulation frequencies;
    digital to analog converter means for converting a composite digital signal comprising said different digital signals at the respective carrier frequencies to analog form, thereby generating a composite analog signal;
    amplifier means for receiving and amplifying said composite analog signal; and
    predistortion means for predistorting said plurality of different digital signals during or after modulation of said different digital signals by said digital modulators and prior to amplification of the composite analog signal by said amplifier means, said predistortion provided by said predistortion means being subsequently altered in dependence on differences between each of said different digital signals and the output at said amplifier means.

2. A transmitter as claimed in claims 1, wherein said input means are arranged to separately receive each of said plurality of different digital signals.

3. A transmitter as claimed in claim 1, wherein combiner means are provided between the input means and the amplifier means for combining said plurality of different digital signals to provided the composite digital signal.

4. A transmitter as claimed in claim 1, wherein the predistortion means are arranged to predistort individually of the plurality of different digital signals.

5. A transmitter as claimed in claim 4, wherein said predistortion means predistorts said signals before the plurality of different digital signals before combining by said combiner means.

6. A transmitter as claimed in claim 3, wherein the predistortion means is arranged to predistort the composite digital signal after the plurality of different digital signals have been combined by the combiner means.

7. A transmitter as claimed in claim 1, comprising a feed back path arranged between the amplifying means and the predistorting means.

8. A transmitter as claimed in claim 7, wherein the predistorting means is arranged to compare an output from the amplifying means from the feedback path with the plurality of different digital signals received by the input means and to provide, if necessary, at least one new predistortion value to be applied to at least one subsequent signal received by said input means.

9. A transmitter as claimed in claim 7, wherein means are provided in said feedback path for separating an output of the amplifying means into the plurality of different digital signals.

10. A transmitter as claimed in claim 9, wherein the predistorting means is arranged to compare each of said separated signals with a corresponding signal received by said input means and to determine if at least one predistortion value needs to be altered.

11. A transmitter as claimed in claim 7, wherein said predistorting means is arranged to compare the composite analog signal from the amplifying means with the plurality of different digital signals to provide, if necessary, at least one new predistortion value.

12. A transmitter as claimed in claim 1, wherein said predistortion means are arranged to provide a plurality of predistortion coefficients, at least one predistortion coefficient being provided for each multicarrier frequency.

13. A transmitter as claimed in claim 12, wherein said predistortion coefficients for each multicarrier frequency takes into account characteristics of other multicarrier frequencies.

14. A transmitter as claimed in claim 13, wherein said characteristics comprise one or more of the following:
    frequency; and distortion.

15. A transmitter as claimed in claim 1, wherein the amplifier means comprises a nonlinear amplifier.

16. A transmitter as claimed in claim 15, wherein said predistortion means is arranged to compensate for a nonlinearity of phase and/or amplitude of the amplifier.

17. A transmitter as claimed in claim 8, wherein analogue to digital converter means are provided for converting the output from the feedback path to digital format prior to the output of the feedback path being input to said predistorting means.

18. A transmitter as claimed in claim 9, wherein analogue to digital converter means are provided for converting the output of the feedback path to digital format prior to the separating means separating the output of the feedback path into the plurality of different digital signals.

19. A base station comprising a transmitter as claimed in claim 1.

20. A mobile station comprising a transmitter as claimed in claim 1.

21. A multi carrier frequency transmission method comprising the steps of:
receiving a plurality of different digital signals to be transmitted, said different signals to be transmitted on different carrier frequencies;
modulating said different digital signals at respective modulation frequencies;
combining said plurality of different digital signals to provide a composite digital signal comprising the different digital signals at the respective carrier frequencies;
converting said composite digital signal to analog form, thereby generating a composite analog signal; and
amplifying said composite analog signal, wherein the method further comprises the steps of:
predistorting the plurality of different digital signals prior to amplification of the composite analog signal by the amplification means during or after the modulation step; and
altering the predistortion applied to subsequent digital signals in dependence on the difference between each of said different digital signals and the amplified signal.

22. A multi frequency carrier transmitter comprising:
input means for receiving a plurality of different digital signals to be transmitted, said different digital signals to be transmitted on different carrier frequencies;
digital modulators for modulating said different digital signals at respective modulation frequencies;
combining means for receiving the different digital signals modulated at the respective frequencies to generate a composite digital signal;
digital to analog converter means for converting the composite digital signal to analog form, generating a composite analog signal;
amplifier means for receiving said composite analog signal and amplifying said composite analog signal; and
predistortion means for predistorting said plurality of digital signals during or after modulation of said different digital signals by said digital modulators and prior to combination of said different digital signals by said combining means, said predistortion provided by said predistortion means being subsequently altered in dependence on a difference between said input different digital signals and an output at said amplifier means.

23. A multi frequency carrier transmitter comprising:
input means for receiving a plurality of different digital signals to be transmitted, said different digital signals to be transmitted on different carrier frequencies;
digital modulators for modulating said different digital signals at respective modulation frequencies;
digital to analog converter means for converting a composite digital signal comprising said different digital signals at the respective carrier frequencies to analog form, generating a composite analog signal;
amplifier means for receiving and amplifying said composite analog signal;
predistortion means for predistorting said plurality of digital signals during or after modulation of said different digital signals by said digital modulators and prior to amplification of the composite digital signal by said amplifier means, said predistortion provided by a said predistortion means being subsequently altered in dependence on a difference between each of said different digital signals and a plurality of different digital sample signals;
analog to digital conversion means for converting a sample of the output of the amplifier means into digital form to generate a composite digital sample signal; and
chanelizing means for converting said composite digital sample signal into the plurality of different digital sample signals.

24. A multi frequency carrier transmitter comprising:
an input for receiving a plurality of different digital signals to be transmitted, said different digital signals to be transmitted on different carrier frequencies;
a plurality of digital modulators for modulating said different digital signal at respective modulation frequencies;
a digital to analog converter for converting a composite digital signal comprising said different digital signals at the respective carrier frequencies to analog form, generating a composite analog signal;
an amplifier for receiving and amplifying said composite analog signal; and
a predistorter for predistorting said plurality of different digital signals during or after modulation of said different digital signals by said digital modulators and prior to amplification of the composite digital signal by said amplifier, said predistortion provided by said predistorter being subsequently altered in dependence on a difference between each of said different digital signals and the output at said amplifier.

25. A multi frequency carrier transmitter comprising:
an input for receiving a plurality of different digital signals to be transmitted, said different digital signals to be transmitted on different carrier frequencies;
a plurality of digital modulators for modulating said different digital signals at respective modulation frequencies;
a combiner for receiving the different digital signals modulated at the respective frequencies to generate a composite digital signal;
a digital to analog converter for converting the composite digital signal to analog form, generating a composite analog signal;
an amplifier for receiving said composite analog signal and amplifying said composite analog signal; and
a predistorter for predistorting said plurality of different digital signals during or after modulation of said different signals by said digital modulators and prior to combination of said different digital signals by said combiner, said predistortion provided by said predistorter being subsequently altered in dependence on a difference between each of said different digital signals and an output at said amplifier.

26. A multi frequency carrier transmitter comprising:
an input for receiving a plurality of different digital signals to be transmitted, said different digital signals to be transmitted on different carrier frequencies;

a plurality of digital modulators for modulating said different digital signals at respective modulation frequencies;

a digital to analog converter for converting a composite digital signal comprising said different digital signals at the respective carrier frequencies to analog form, generating a composite analog signal;

an amplifier for receiving and amplifying said composite analog signal;

a predistorter for predistorting said plurality of different digital signals during or after modulation of said different digital signals by said digital modulators and prior to amplification of the composite digital signal by said amplifier, said predistortion provided by a said predistorter being subsequently altered in dependence on a difference between each of said different digital signals and a plurality of different digital sample signals;

an analog to digital converter for converting a sample of the output of the amplifier into digital form to generate a composite digital sample signal; and a chanelizer for converting said composite digital sample signal into the plurality of different digital sample signals.

27. A multi frequency carrier transmitter comprising:

input means for receiving a plurality of different digital signals to be transmitted, said different digital signals to be transmitted on different carrier frequencies;

digital modulators for modulating said different digital signal at respective modulation frequencies, said modulation frequencies being an intermediate frequency;

digital to analog converter means for converting a composite digital signal comprising said different digital signals at the respective carrier frequencies to analog form, thereby generating a composite analog signal;

amplifier means for receiving and amplifying said composite analog signal; and predistortion means for predistorting said plurality of different digital signals during or after modulation of said different digital signals by said digital modulators at said intermediate frequency and prior to amplification of the composite analog signal by said amplifier means, said predistortion provided by said predistortion means being subsequently altered in dependence on differences between each of said different digital signals and the output at said amplifier means.

28. A multi carrier frequency transmission method comprising the steps of:

receiving a plurality of different digital signals to be transmitted, said different signals to be transmitted on different carrier frequencies;

modulating said different digital signals at respective modulation frequencies, said modulation frequencies being an intermediate frequency;

combining said plurality of different digital signals to provide a composite digital signal comprising the different digital signals at the respective carrier frequencies;

converting said composite digital signal to analog form, thereby generating a composite analog signal; and amplifying said composite analog signal, wherein the method further comprises the steps of:

predistorting the plurality of different digital signals prior to amplification of the composite analog signal by the amplification means during or after the modulation of said different digital signals by the modulating means at said intermediate frequency; and altering the predistortion applied to subsequent digital signals in dependence on the difference between each of said different digital signals and the amplified signal.

29. A multi frequency carrier transmitter comprising:

input means for receiving a plurality of different digital signals to be transmitted, said different digital signals to be transmitted on different carrier frequencies;

digital modulators for modulating said different digital signals at respective modulation frequencies, said modulation frequencies being an intermediate frequency;

combining means for receiving the different digital signals modulated at the respective frequencies to generate a composite digital signal;

digital to analog converter means for converting the composite digital signal to analog form, generating a composite analog signal;

amplifier means for receiving said composite analog signal and amplifying said composite analog signal; and predistortion means for predistorting said plurality of digital signals during or after modulation of said different digital signals by said digital modulators at said intermediate frequency and prior to combination of said different digital signals by said combining means, said predistortion provided by said predistortion means being subsequently altered in dependence on a difference between said input different digital signals and an output at said amplifier means.

30. A multi frequency carrier transmitter comprising:

input means for receiving a plurality of different digital signals to be transmitted, said different digital signals to be transmitted on different carrier frequencies;

digital modulators for modulating said different digital signals at respective modulation frequencies, said modulation frequencies being an intermediate frequency;

digital to analog converter means for converting a composite digital signal comprising said different digital signals at the respective carrier frequencies to analog form, generating a composite analog signal;

amplifier means for receiving and amplifying said composite analog signal;

predistortion means for predistorting said plurality of digital signals during or after modulation of said different digital signals by said digital modulators at said intermediate frequency and prior to amplification of the composite digital signal by said amplifier means, said predistortion provided by a said predistortion means being subsequently altered in dependence on a difference between each of said different digital signals and a plurality of different digital sample signals;

analog to digital conversion means for converting a sample of the output of the amplifier means into digital form to generate a composite digital sample signal; and chanelizing means for converting said composite digital sample signal into the plurality of different digital sample signals.

31. A multi frequency carrier transmitter comprising:

an input for receiving a plurality of different digital signals to be transmitted, said different digital signals to be transmitted on different carrier frequencies;

a plurality of digital modulators for modulating said different digital signals at respective modulation frequencies, said modulation frequencies being an intermediate frequency;

a digital to analog converter for converting a composite digital signal comprising said different digital signals at the respective carrier frequencies to analog form, generating a composite analog signal;

an amplifier for receiving and amplifying said composite analog signal; and a predistorter for predistorting said plurality of different digital signals during or after modulation of said different digital signals by said digital modulators at said intermediate frequency and prior to amplification of the composite digital signal by said amplifier, said predistortion provided by said predistorter being subsequently altered in dependence on a difference between each of said different digital signals and the output at said amplifier.

32. A multi frequency carrier transmitter comprising:

an input for receiving a plurality of different digital signals to be transmitted, said different digital signals to be transmitted on different carrier frequencies;

a plurality of digital modulators for modulating said different digital signals at respective modulation frequencies, said modulation frequencies being an intermediate frequency;

a combiner for receiving the different digital signals modulated at the respective frequencies to generate a composite digital signal;

a digital to analog converter for converting the composite digital signal to analog form, generating a composite analog signal;

an amplifier for receiving said composite analog signal and amplifying said composite analog signal; and a predistorter for predistorting said plurality of different digital signals during or after modulation of said different signals by said digital modulators at said intermediate frequency and prior to combination of said different digital signals by said combiner, said predistortion provided by said predistorter being subsequently altered in dependence on a difference between each of said different digital signals and an output at said amplifier.

33. A multi frequency carrier transmitter comprising:

an input for receiving a plurality of different digital signals to be transmitted, said different digital signals to be transmitted on different carrier frequencies;

a plurality of digital modulators for modulating said different digital signals at respective modulation frequencies, said modulation frequencies being an intermediate frequency;

a digital to analog converter for converting a composite digital signal comprising said different digital signals at the respective carrier frequencies to analog form, generating a composite analog signal;

an amplifier for receiving and amplifying said composite analog signal;

a predistorter for predistorting said plurality of different digital signals during or after modulation of said different digital signals by said digital modulators at said intermediate frequency and prior to amplification of the composite digital signal by said amplifier, said predistortion provided by a said predistorter being subsequently altered in dependence on a difference between each of said different digital signals and a plurality of different digital sample signals;

an analog to digital converter for converting a sample of the output of the amplifier into digital form to generate a composite digital sample signal; and a chanelizer for converting said composite digital sample signal into the plurality of different digital sample signals.

* * * * *